United States Patent
Hopkins et al.

(10) Patent No.: US 12,232,317 B2
(45) Date of Patent: Feb. 18, 2025

(54) MEMORY ARRAYS COMPRISING STRINGS OF MEMORY CELLS AND METHODS USED IN FORMING A MEMORY ARRAY COMPRISING STRINGS OF MEMORY CELLS

(71) Applicant: Micron Technology, Inc., Boise, ID (US)

(72) Inventors: John D. Hopkins, Meridian, ID (US); Damir Fazil, Boise, ID (US); Michael E. Koltonski, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 412 days.

(21) Appl. No.: 17/666,844

(22) Filed: Feb. 8, 2022

(65) Prior Publication Data

US 2023/0253465 A1    Aug. 10, 2023

(51) Int. Cl.
| | |
|---|---|
| H10B 43/27 | (2023.01) |
| H01L 21/28 | (2006.01) |
| H10B 41/27 | (2023.01) |
| H10B 41/41 | (2023.01) |
| H10B 43/10 | (2023.01) |

(52) U.S. Cl.
CPC ........ *H10B 43/27* (2023.02); *H01L 29/40117* (2019.08); *H10B 41/27* (2023.02); *H10B 41/41* (2023.02); *H10B 43/10* (2023.02)

(58) Field of Classification Search
None
See application file for complete search history.

(56) References Cited

U.S. PATENT DOCUMENTS

| | | | |
|---|---|---|---|
| 2011/0291177 A1* | 12/2011 | Lee .................. | H10B 43/27 |
| | | | 257/E21.423 |
| 2012/0146127 A1* | 6/2012 | Lee .................. | H01L 29/66833 |
| | | | 257/E21.423 |
| 2013/0161818 A1* | 6/2013 | Han .................. | H01L 27/0688 |
| | | | 438/653 |
| 2014/0193969 A1* | 7/2014 | Hull .................. | H01L 29/511 |
| | | | 438/593 |
| 2019/0305096 A1* | 10/2019 | Choi ................. | H01L 29/41741 |
| 2020/0402890 A1 | 12/2020 | Chary et al. | |
| 2021/0013221 A1 | 1/2021 | Daycock et al. | |
| 2021/0043644 A1 | 2/2021 | Hu et al. | |

\* cited by examiner

*Primary Examiner* — Scott B Geyer
(74) *Attorney, Agent, or Firm* — Wells St. John P.S.

(57) ABSTRACT

A memory array comprises strings of memory cells. The memory array comprises laterally-spaced memory blocks individually comprising a vertical stack comprising alternating insulative tiers and conductive tiers above a conductor tier. Channel-material-string constructions of memory cells extend through the insulative tiers and the conductive tiers. The channel material of the channel-material-string constructions is directly electrically coupled to conductor material of the conductor tier. Substructure material is in the conductor tier and spans laterally-across and laterally-between bottoms of multiple of the channel-material-string constructions. The substructure material is of different composition from an upper portion of the conductor material. The substructure material comprises laterally-opposing sides that taper laterally-inward moving deeper into the conductor tier. Other embodiments, including method, are disclosed.

26 Claims, 18 Drawing Sheets

MEMORY ARRAYS COMPRISING STRINGS OF MEMORY CELLS AND METHODS USED IN FORMING A MEMORY ARRAY COMPRISING STRINGS OF MEMORY CELLS

TECHNICAL FIELD

Embodiments disclosed herein pertain to memory arrays comprising strings of memory cells and to methods used in forming a memory array comprising strings of memory cells.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region therebetween. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

DETAILED DESCRIPTION OF EXAMPLE EMBODIMENTS

Embodiments of the invention encompass methods used in forming a memory array, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. Example method embodiments are described with reference to FIGS. 1-30 which may be considered as "gate-last" or "replacement-gate" processing. Further, and regardless, the following sequence of processing steps is but one example and other sequences of the example processing steps (with or without other processing steps) may be used regardless of whether using "gate-last/replacement-gate" processing.

Figure 1:
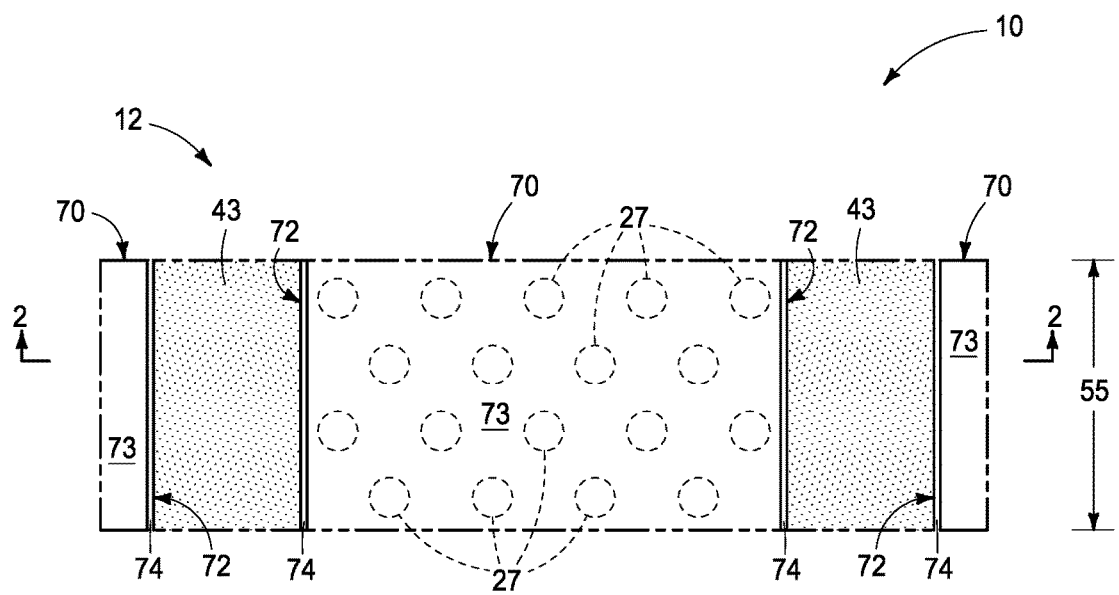
FIGS. 1 and 2 are diagrammatic cross-sectional views of portions of a construction that will comprise an array of elevationally-extending strings of memory cells in accordance with an embodiment of the invention.
Figure 2:
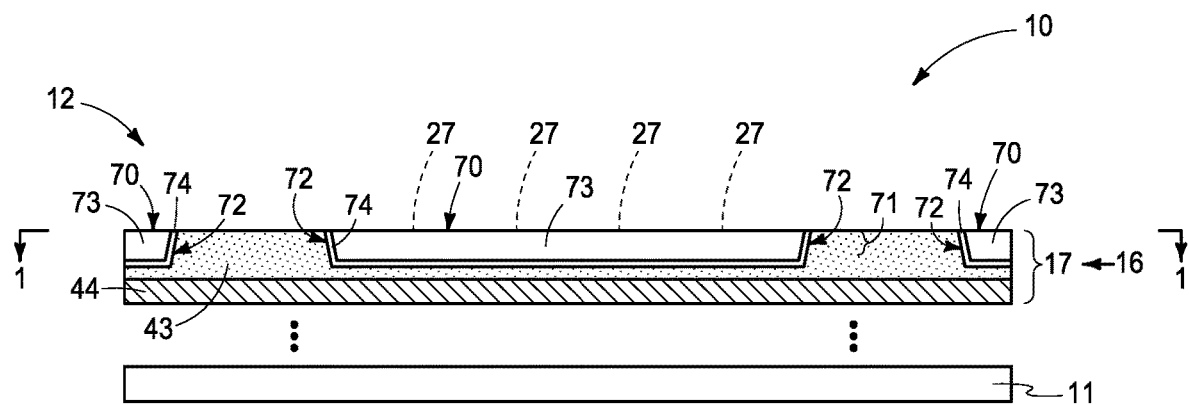

FIGS. 1 and 2 show a construction 10 having an array or array area 12 in which elevationally-extending strings of transistors and/or memory cells will be formed. Construction 10 comprises a base substrate 11 having any one or more of conductive/conductor/conducting, semiconductive/semiconductor/semiconducting, or insulative/insulator/insulating (i.e., electrically herein) materials. Various materials have been formed elevationally over base substrate 11. Materials may be aside, elevationally inward, or elevationally outward of the FIGS. 1 and 2-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 has been formed above substrate 11. Conductor material 17 as shown comprises upper conductor material 43 directly above and directly electrically coupled to (e.g., directly against) lower conductor material 44 of different composition from upper conductor material 43. An example upper conductor material 43 comprises conductively-doped semiconductive material (e.g., n-type-doped or p-type-doped polysilicon). An example lower conductor material 44 comprises metal material (e.g., a metal silicide such as $WSi_x$). Conductor tier 16 may comprise part of control circuitry (e.g., peripheral-under-array circuitry and/or a common source line or plate) used to control read and write access to the transistors and/or memory cells that will be formed in array 12.

Conductor tier 16 comprises etch-stop material 70 spanning laterally-across and laterally-between multiple locations 27 where individual channel-material-string constructions will be formed. In some embodiments, etch-stop material is referred to as substructure material (i.e., material that underlies another structure). Etch-stop material 70 is of different composition from an upper portion 71 (e.g., an uppermost portion) of conductor material 17. Etch-stop material 70 may comprise conductive material, semiconductive material, and/or insulative material. Example etch-stop material 71 is shown as comprising material 73 (e.g., an aluminum oxide, such as $Al_2O_3$) atop material 74 (e.g., a silicon oxide, such as $SiO_2$). In one embodiment, etch-stop material 70 comprises at least one of carbon, a silicon nitride, a carbon-doped silicon nitride, a metal nitride, and a metal silicide. In one embodiment, upper portion 71 comprises conductively-doped polysilicon and etch-stop material 70 comprises an aluminum oxide. Example etch-stop material 70 is shown as extending continuously along a direction 55. Alternately, and by way of examples only, the etch-stop material may be segmented along direction 55, for example comprising spaced rows of the etch-stop material 70 running at an angle relative to direction 55 (e.g., orthogonal to direction 55 or otherwise, and not shown).

Figure 3:
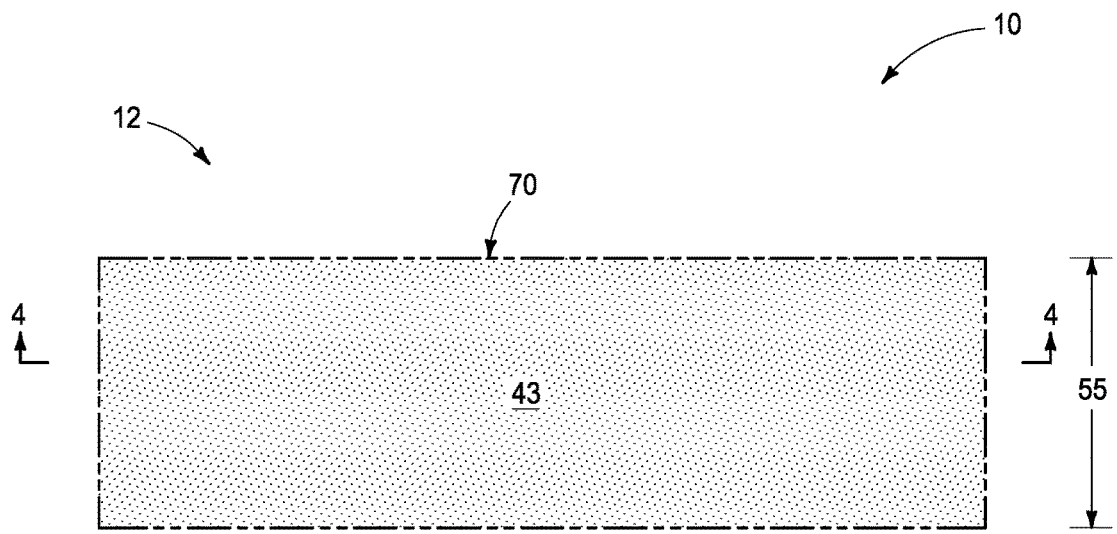
FIGS. 3-30 are diagrammatic sequential sectional and/or enlarged views of the construction of FIGS. 1 and 2, or portions thereof or alternate and/or additional embodiments, in process in accordance with some embodiments of the invention.
Figure 4:
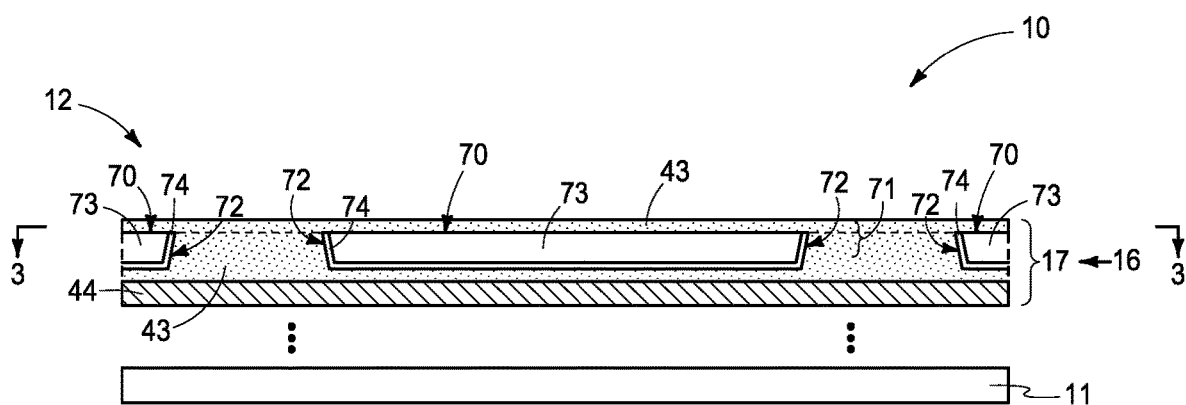

Referring to FIGS. 3 and 4, and in one embodiment, upper portion 71 of conductor material 17 has been formed directly above etch-stop material 70. Such may protect etch-stop material 70 from being etched in subsequent etching described below.

Figure 5:
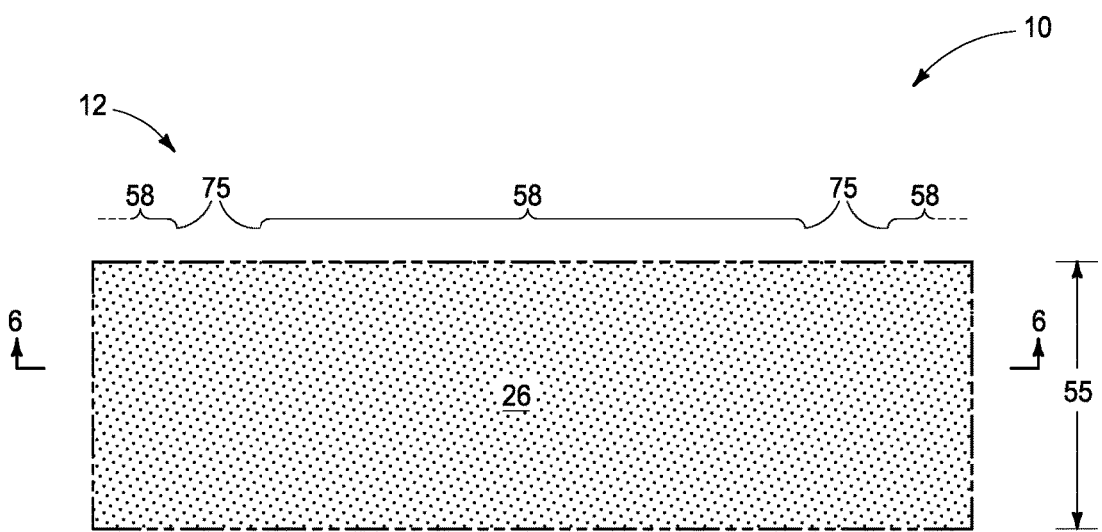
Figure 6:
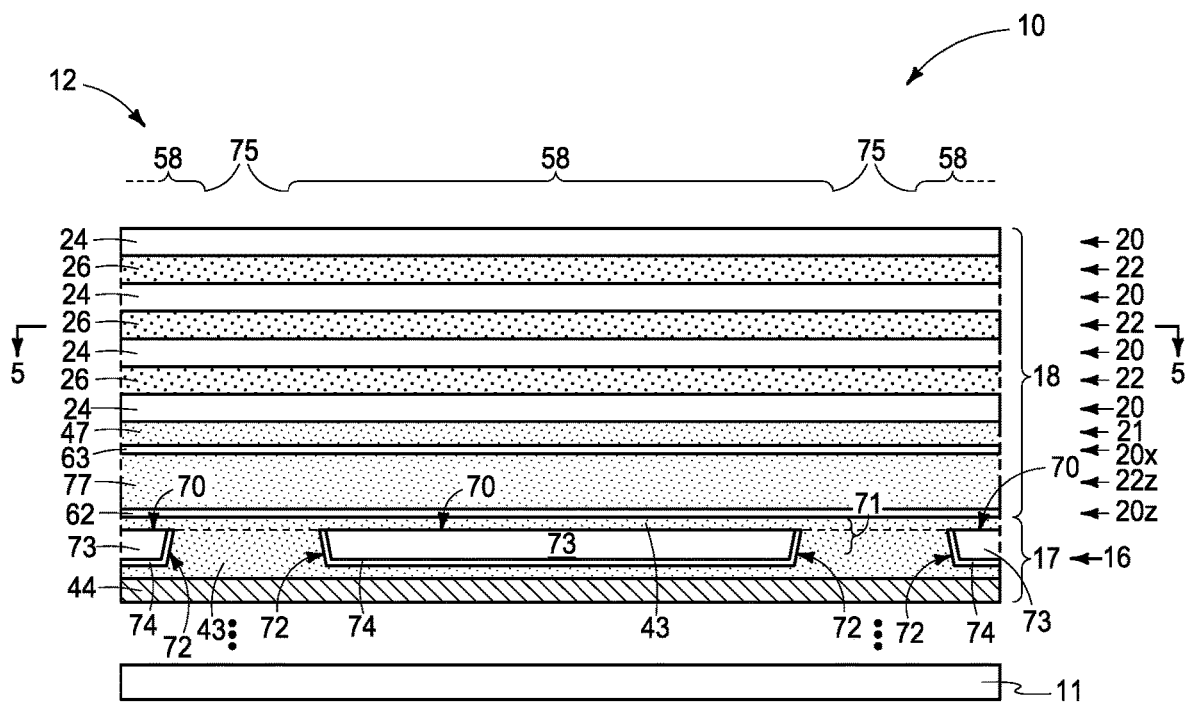

Referring to FIGS. 5 and 6, a stack 18 comprising vertically-alternating insulative tiers 20* and conductive tiers 22* has been formed directly above conductor tier 16 and etch-stop material 70 (an * being used as a suffix to be inclusive of all such same-numerically-designated components that may or may not have other suffixes). Stack 18 and conductor tier 16 collectively comprise laterally-spaced memory-block regions 58 that will comprise laterally-spaced memory blocks 58 in a finished circuitry construction. Memory-block regions 58 and resultant memory blocks 58 (not yet shown) may be considered as being longitudinally elongated and oriented, for example horizontally-parallel relative one another, along direction 55. Memory-block regions 58 may not be discernable at this point of processing.

Conductive tiers 22* (alternately referred to as first tiers) may not comprise conducting material and insulative tiers 20* (alternately referred to as second tiers) may not comprise insulative material or be insulative at this point in processing in conjunction with the hereby initially-described example method embodiment which is "gate-last" or "replacement-gate". In one embodiment, stack 18 comprises a lowest tier 20z of second tiers 20* directly above (e.g., directly against) conductor material 17. Example lowest second tier 20z is insulative and may be sacrificial (e.g., in array 12; e.g., comprising material 62, for example silicon dioxide and/or silicon nitride). A next-lowest second tier 20x of second tiers 20* is directly above lowest second tier 20z and may be sacrificial (e.g., in array 12; e.g., comprising material 63, for example silicon dioxide and/or silicon nitride). A lowest tier 22z of first tiers 22* comprising sacrificial material 77 (e.g., polysilicon or silicon nitride) is vertically between lowest second tier 20z and next-lowest second tier 20x. Example stack 18 comprises a conducting-material tier 21 comprising conducting material 47 (e.g., conductively-doped polysilicon) that is directly above next-lowest second tier 20x. Additional tiers may be present. For example, one or more additional tiers may be between tier 21 and 20x (not shown) and/or below tier 22z (other than 20z not being shown).

Only a small number of tiers 20 and 22 is shown, with more likely stack 18 comprising dozens, a hundred or more, etc. of tiers 20 and 22. Example conductive tiers 22 comprise first material 26 (e.g., silicon nitride) which may be wholly or partially sacrificial. Example insulative tiers 20 comprise second material 24 (e.g., silicon dioxide) that is of different composition from that of first material 26 and which may be wholly or partially sacrificial. Further, other circuitry that may or may not be part of peripheral and/or control circuitry may be between conductor tier 16 and stack 18. By way of example only, multiple vertically-alternating tiers of conductive material and insulative material of such circuitry may be below lowest conductive tier 22 above conducting tier 21 and/or above uppermost conductive tier 22. For example, one or more select gate tiers (not shown) may be between conductor tier 16 and lowest conductive tier 22 above conducting tier 21 and one or more select gate tiers may be above uppermost conductive tier 22. Alternately or additionally, at least one of the depicted uppermost and lowest conductive tiers 22 may be a select gate tier.

In one embodiment, etch-stop material 70 has been formed to comprise (a) or (b), where
  (a): laterally-opposing sides (e.g., 72) that taper laterally-inward moving deeper into conductor tier 16; and
  (b): laterally-opposing sides (e.g., 72) that are everywhere spaced laterally-inward of laterally-opposing sides (e.g., 75) of laterally-spaced memory-block regions 58.

In one embodiment etch-stop material 70 is formed to comprise the (a), in one embodiment to comprise the (b), and in one embodiment to comprise the (a) and the (b) (each being shown). In one embodiment, etch-stop material 70 is formed to comprise only the (a) and in one embodiment is formed to comprise only the (b) (neither being shown).

Figure 7:
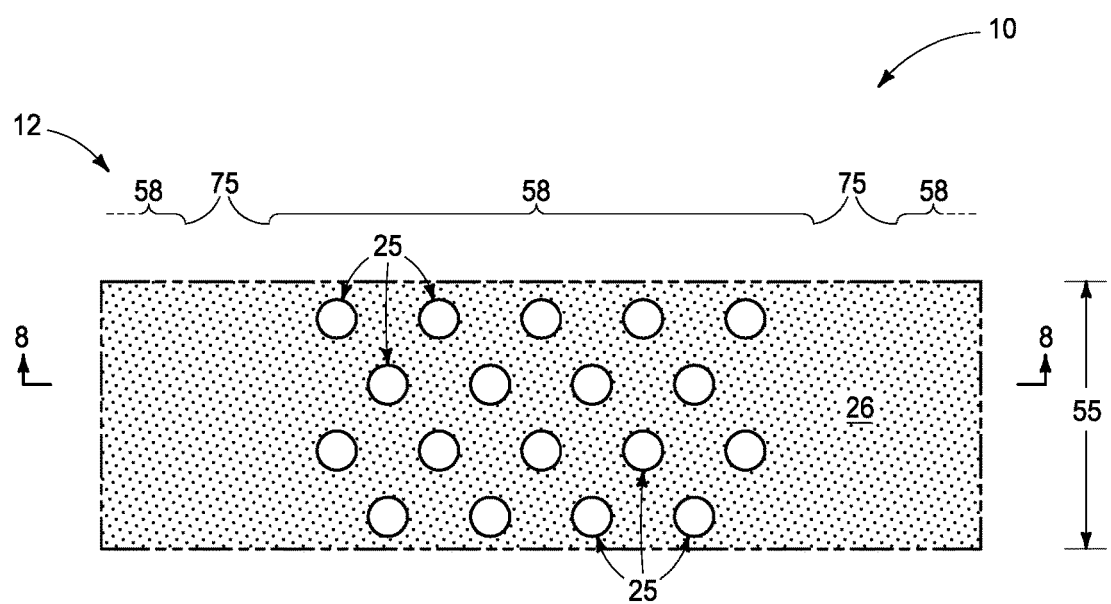
Figure 8:
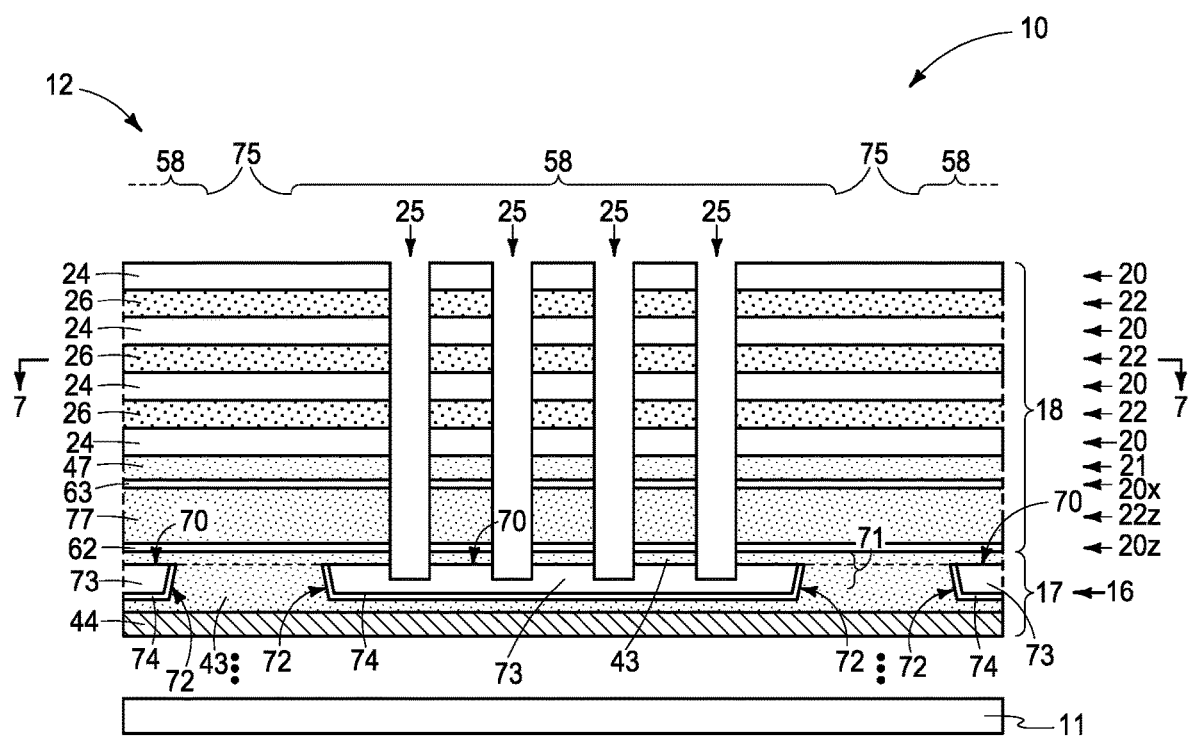
Figure 9:
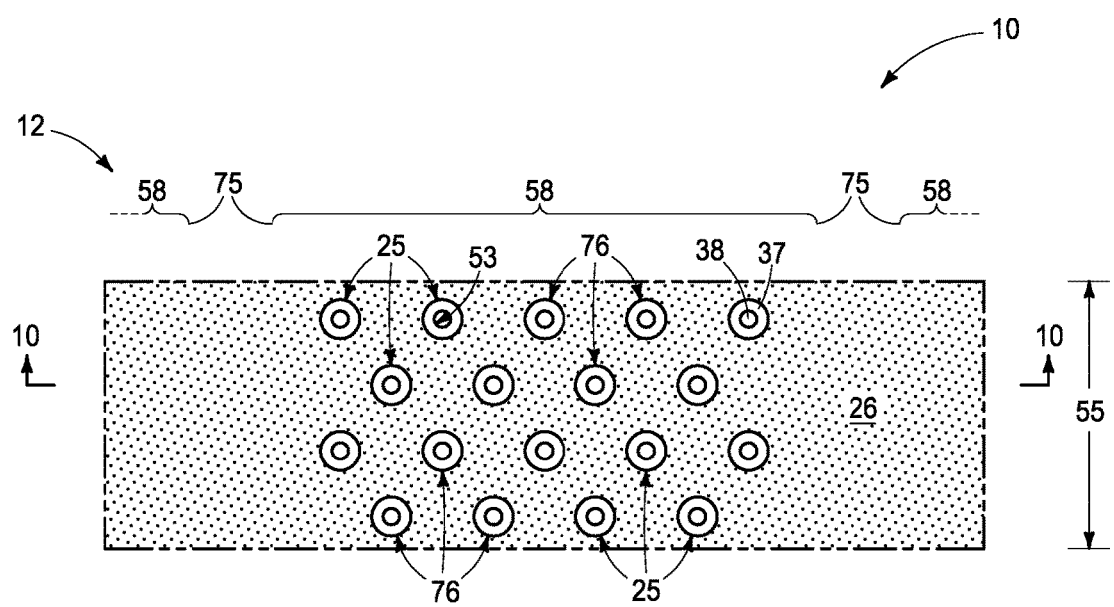
Figure 10:
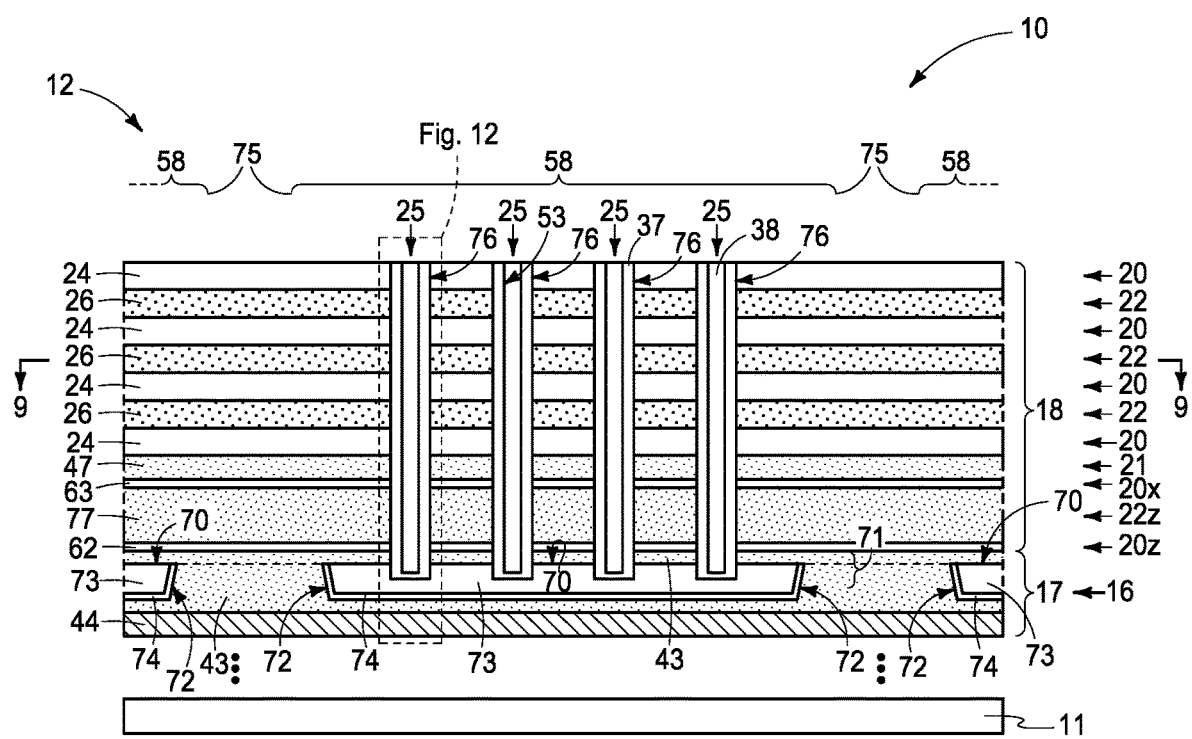
Figure 11:
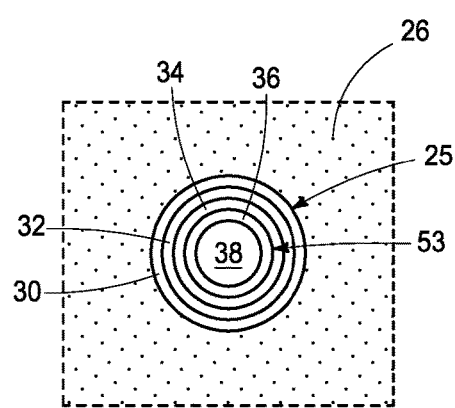
Figure 12:
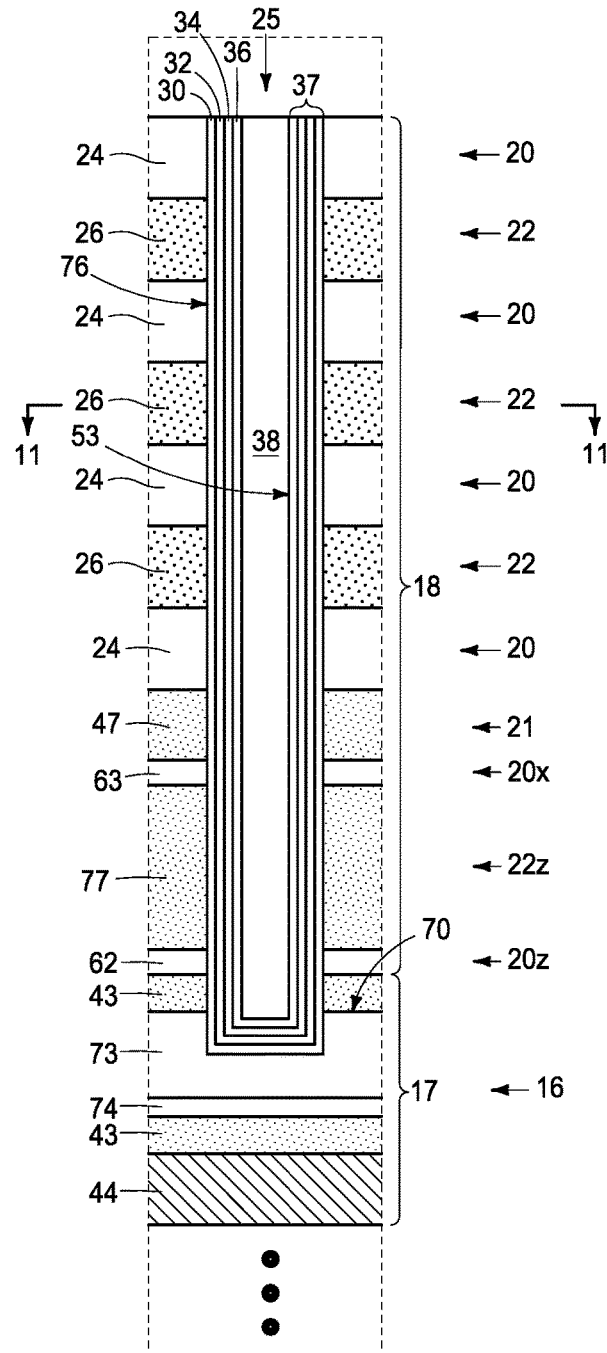

Referring to FIGS. 7 and 8, channel openings 25 have been etched through first tiers 22, second tiers 20, conducting tier 21 (when present), and upper portion 71 of conductor material 17 (when present above etch-stop material 70) to stop on etch-stop material 70 (i.e., atop or within). FIGS. 7 and 8 show an example embodiment where channel openings 25 have been etched to extend into etch-stop material 70. Channel openings 25 may taper radially-inward or laterally-outward moving deeper into stack 18* (not shown).

Transistor channel material may be formed in the individual channel openings elevationally along the insulative tiers and the conductive tiers, thus comprising individual channel-material strings, which is directly electrically coupled with conductor material in the conductor tier. Individual memory cells of the example memory array being formed may comprise a gate region (e.g., a control-gate region) and a memory structure laterally-between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally-between the channel material and the storage material.

Referring to FIGS. 9-12, a channel-material-string construction 76 has been formed in individual channel openings 25 directly above etch-stop material 70. In one embodiment and as shown, channel-material-string construction 76 extends into etch-stop material 70. Example channel-material-string construction 76 comprises charge-blocking material 30, storage material 32, and charge-passage material 34 elevationally along insulative tiers 20 and conductive tiers 22. Transistor materials 30, 32, and 34 (e.g., memory-cell materials) may be formed by, for example, deposition of respective thin layers thereof over stack 18* and in individual openings 25 followed by planarizing such back at least to a top surface of stack 18. Channel-material-string construction 76 comprises channel material 36 as a channel-material string 53. Materials 30, 32, 34, and 36 are collectively shown as and only designated as material 37 in some figures due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted to remove materials 30, 32, and 34 from the bases of channel openings 25 (not shown) to expose conductor tier 16 such that channel material 36 is directly against (directly electrically coupled to) conductor material 17 of conductor tier 16. Such punch etching may occur separately with respect to each of materials 30, 32, and 34 or may occur with respect to only some (not shown). Alternately, and by way of example only, no punch etching may be conducted and channel material 36 may be directly electrically coupled to conductor material 17 of conductor tier 16 only by a separate conductive interconnect (not yet shown). A radially-central solid dielectric material 38 (e.g., spin-on-dielectric, silicon dioxide, and/or silicon nitride) is shown in channel openings 25. Alternately, and by way of example only, the radially-central portion in channel openings 25 may include void space(s) (not shown) and/or be devoid of solid material (not shown).

Figure 13:
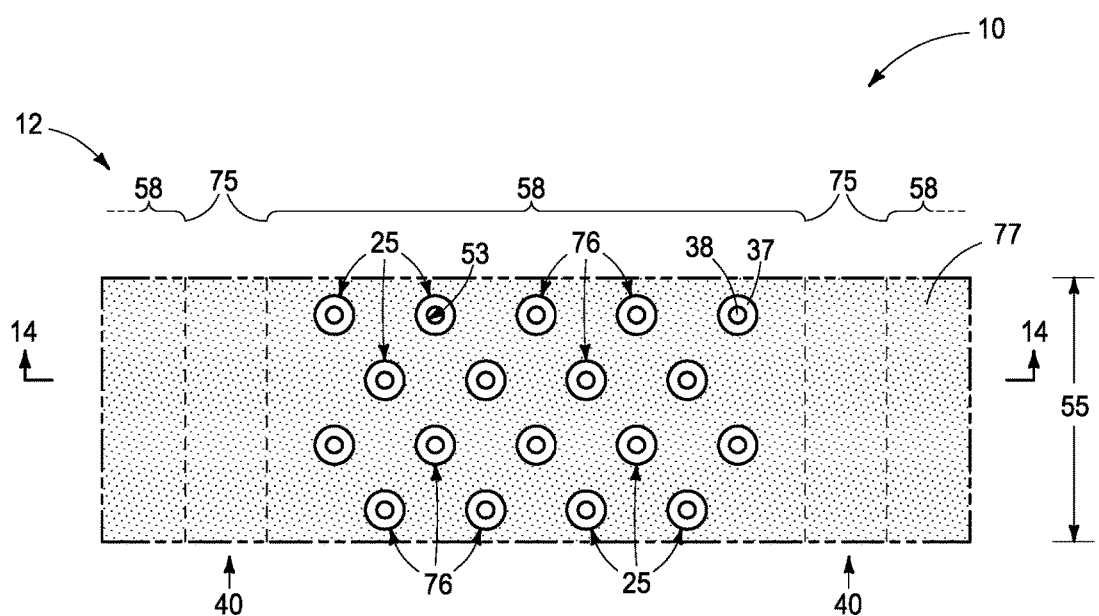
Figure 14:
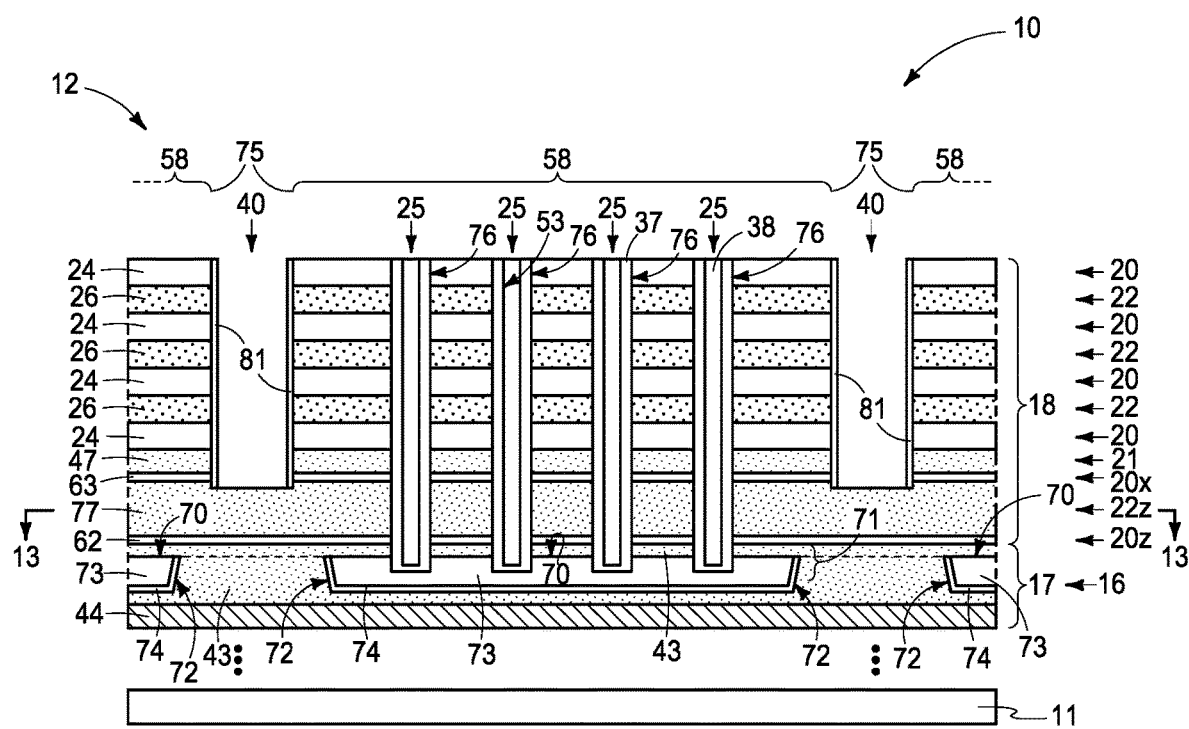

Referring to FIGS. 13 and 14, horizontally-elongated trenches 40 have been formed (e.g., by anisotropic etching) into stack 18 to lowest conductive tier 22z and that are individually between immediately-laterally-adjacent memory-block regions 58. A sacrificial etch-stop line (not shown) having the same general horizontal outline as trenches 40 may individually be formed as part of and in a lower portion of stack 18 prior to forming trenches 40. Trenches 40 may then be formed by etching materials 24 and 26 to stop on the material of the individual sacrificial lines, followed by exhuming remaining material of such sacrificial lines. Trenches 40 may taper laterally-inward or laterally-outward moving deeper into stack 18 (not shown). By way of example and for brevity only, channel openings 25 are shown as being arranged in groups or columns of staggered rows of four and five channel openings 25 per row. Trenches 40 will typically be wider than channel openings 25 (e.g., 3 to 10 times wider). Any alternate existing or future-developed arrangement and construction may be used. An insulative liner 81 (e.g., hafnium oxide, aluminum oxide, multiple layers of silicon dioxide and silicon nitride, etc.) has been formed in trenches 40 followed by punch-etching there-through to expose material 77 therebelow. Trenches 40 and channel openings 25 (and material formed therein) may be formed in any order relative the other or at the same time.

Figure 15:
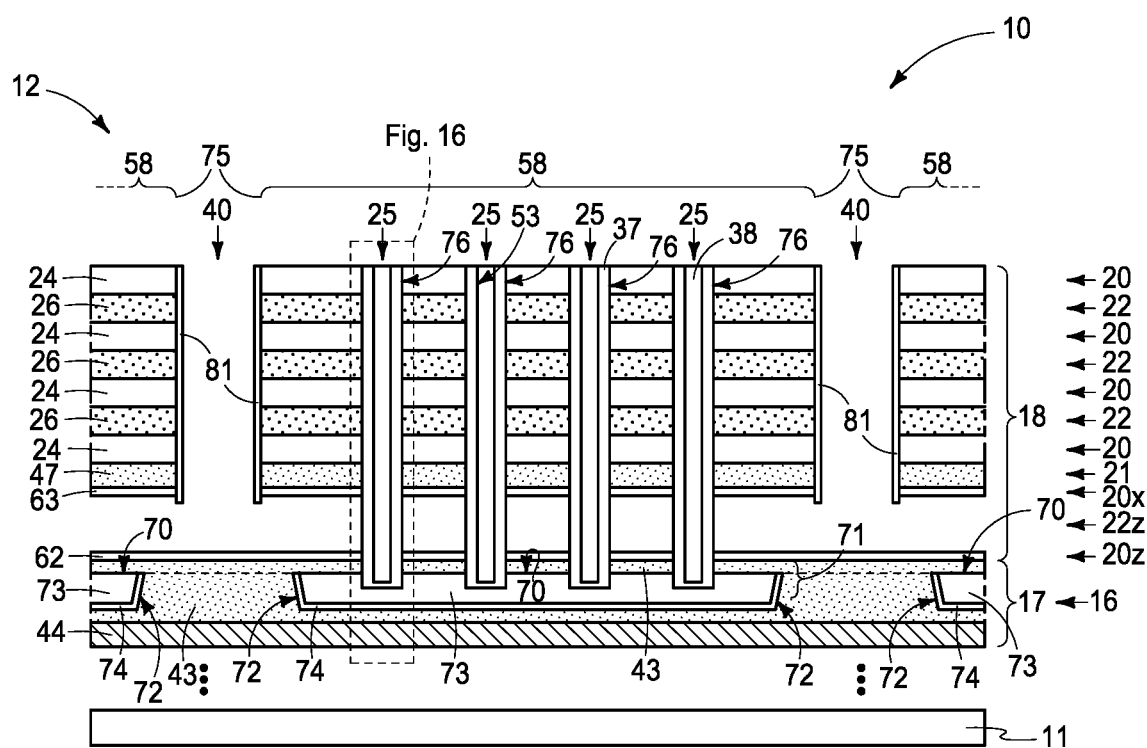
Figure 16:
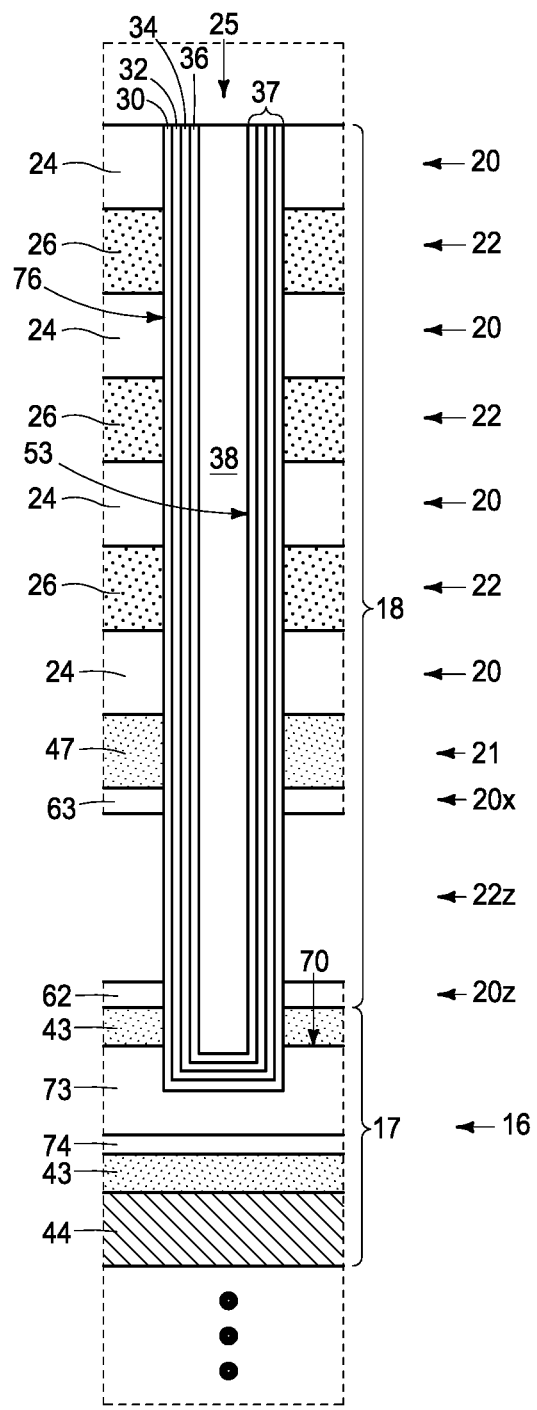

Referring to FIGS. 15 and 16, sacrificial material 77 (not shown) has been removed (e.g., by isotropic etching) from lowest first tier 22z through trenches 40. Such may occur, for example, by isotropic etching that is ideally conducted selectively relative to materials 62 and 63, for example using liquid or vapor $H_3PO_4$ as a primary etchant where material 77 is silicon nitride or using tetramethyl ammonium hydroxide [TMAH] where material 77 is polysilicon.

Figure 17:
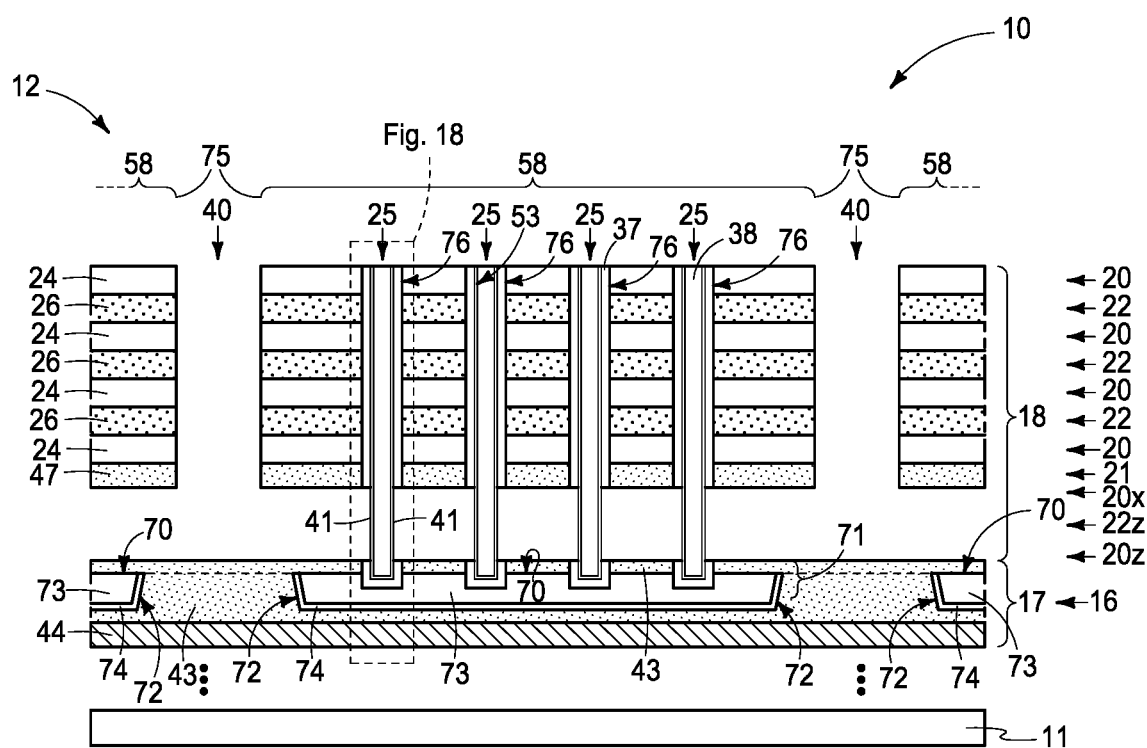
Figure 18:
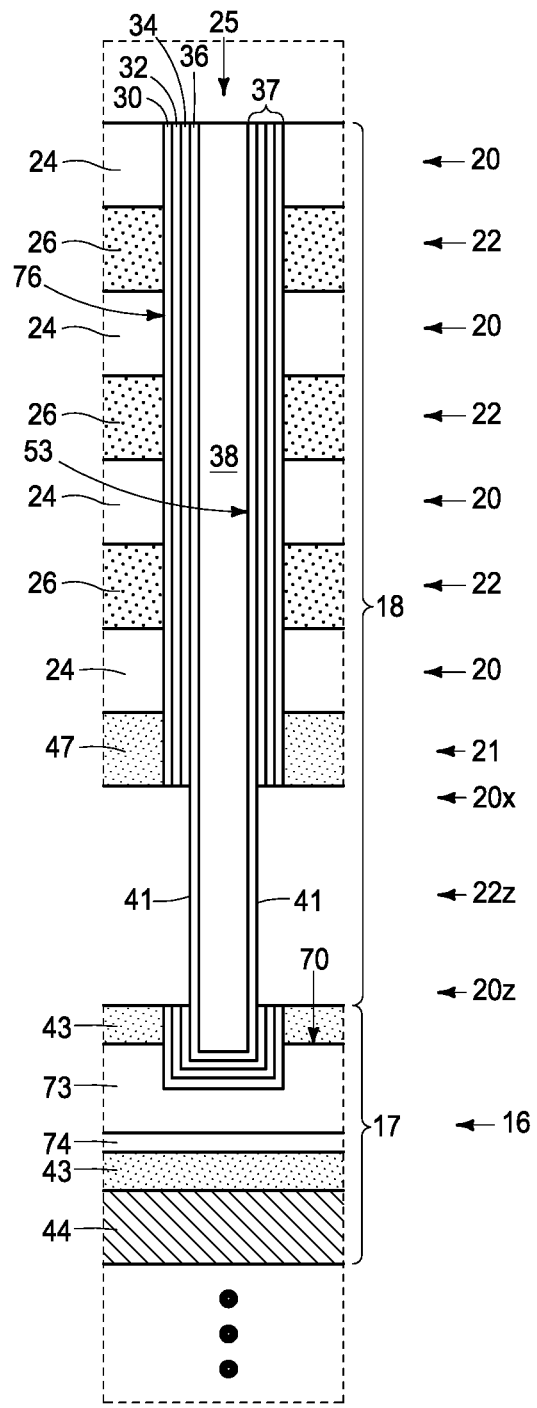

FIGS. 17 and 18 show example subsequent processing wherein, in one embodiment, material 30 (e.g., silicon dioxide), material 32 (e.g., silicon nitride), and material 34 (e.g., silicon dioxide or a combination of silicon dioxide and silicon nitride) have been etched in tier 22z to expose a sidewall 41 of channel material 36 of channel-material strings 53 in lowest first tier 22z. Any of materials 30, 32, and 34 in tier 22z may be considered as being sacrificial material therein. As an example, consider an embodiment where liner 81 (not shown) is one or more insulative oxides (other than solely silicon dioxide) and memory-cell materials 30, 32, and 34 individually are one or more of silicon dioxide and silicon nitride layers. In such example, the depicted construction can result by using modified or different chemistries for sequentially etching silicon dioxide and silicon nitride selectively relative to the other. As examples, a solution of 100:1 (by volume) water to HF will etch silicon dioxide selectively relative to silicon nitride, whereas a solution of 1000:1 (by volume) water to HF will etch silicon nitride selectively relative to silicon dioxide. Accordingly, and in such example, such etching chemistries can be used in an alternating manner where it is desired to achieve the example depicted construction. In one embodiment, such etching may be conducted selectively relative to liner 81 (when present, and liner 81 not being shown). In one embodiment and as shown, materials 62 and 63 (not shown) have been removed. When so removed, such may be removed when removing materials 30, 32, and 34 are removed, for example if materials 62 and 63 comprise one or both of silicon dioxide and silicon nitride. Alternately, when so removed, such may be removed separately (e.g., by isotropic etching). The artisan is capable of selecting other chemistries for etching other different materials where a construction as shown is desired. If liner 81 (not shown) comprises multiple layers of silicon dioxide and silicon nitride, such may be removed (e.g., by etching) commensurate with removal of materials 30, 32, 34, 62, and 63 where such collectively comprise silicon nitride and silicon dioxide. Alternately, liner 81 may remain at this point of processing (not shown) or be separately or otherwise removed. Regardless, and by way of example, presence of at least a part of upper portion 71 of conductor material 17 directly above etch-stop material 70 may facilitate preclusion of etching etch-stop material 70 when etching materials 30, 32, 34, 63, and/or 62 if such is desired.

Figure 19:
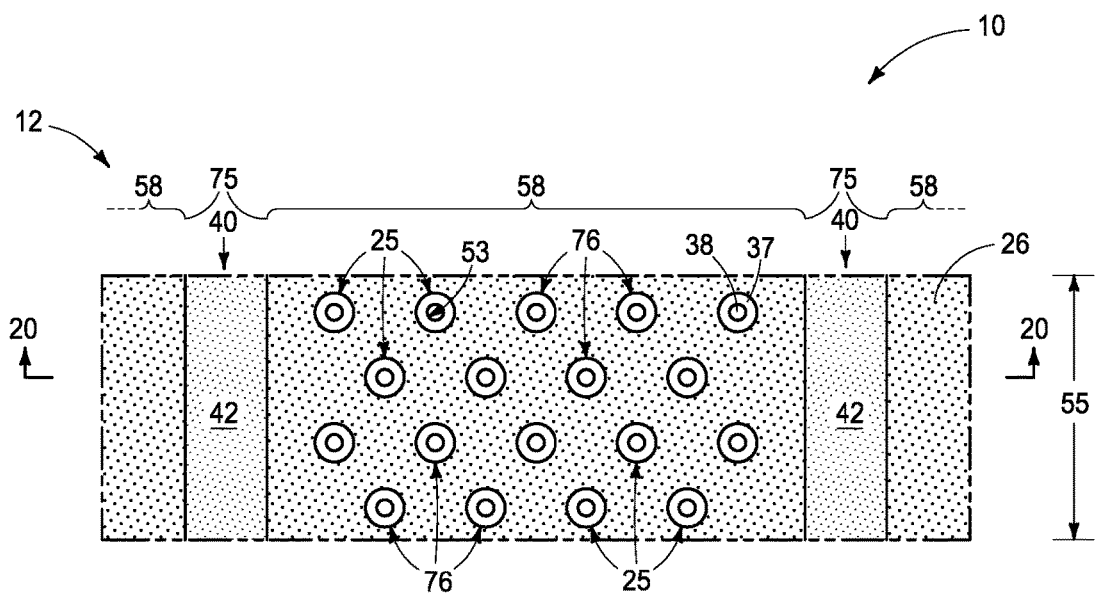
Figure 20:
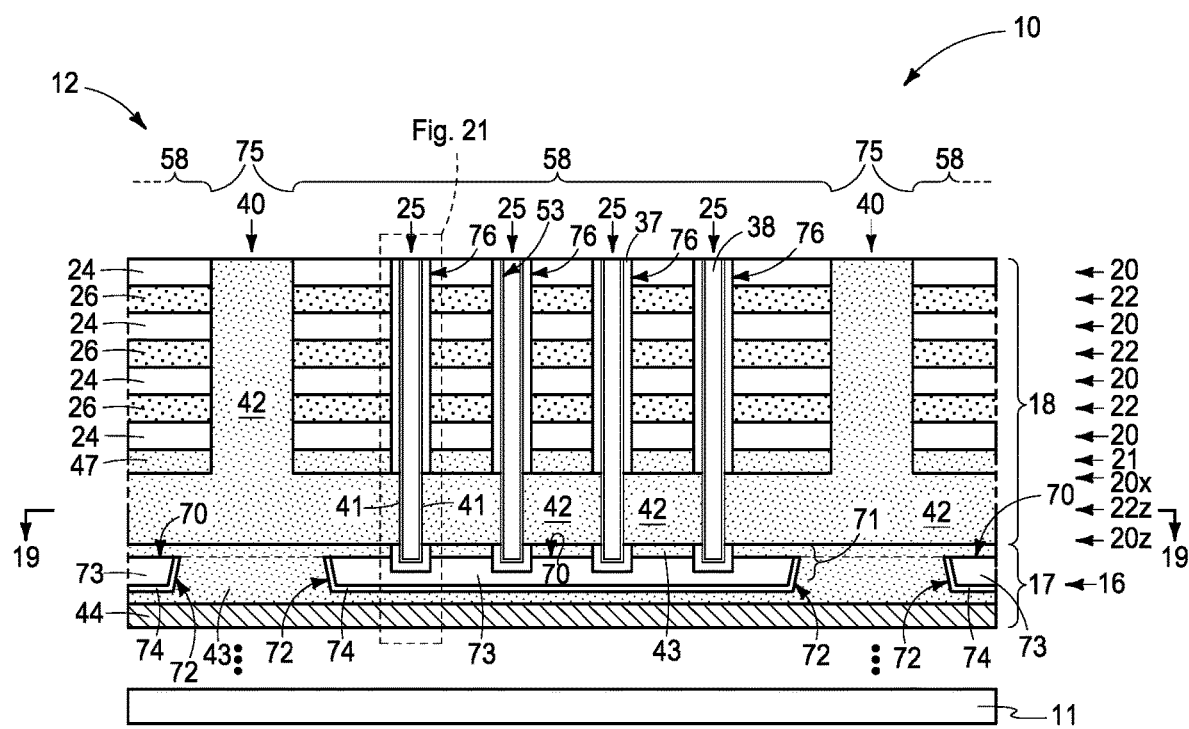
Figure 21:
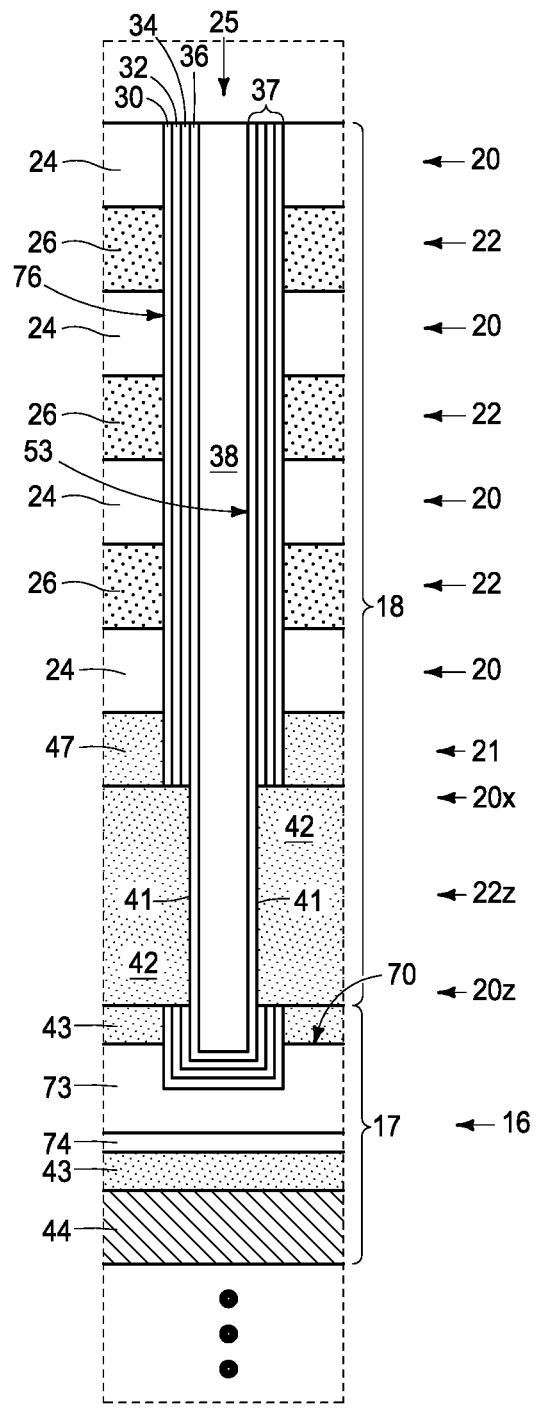

Referring to FIGS. 19-21, after exposing sidewall 41, conductive material 42 (e.g., conductively-doped polysilicon) has been formed in lowest first tier 22z and in one embodiment directly against sidewall 41 of channel material 36. In one embodiment and as shown, such has been formed directly against a bottom of conducting material 47 of conducting-material tier 21 and directly against a top of conductor material 43 of conductor tier 16, thereby directly electrically coupling together channel material 36 of individual channel-material strings 53 with conductor material 43 of conductor tier 16 and conducting material 47 of conducting-material tier 21.

Figure 22:
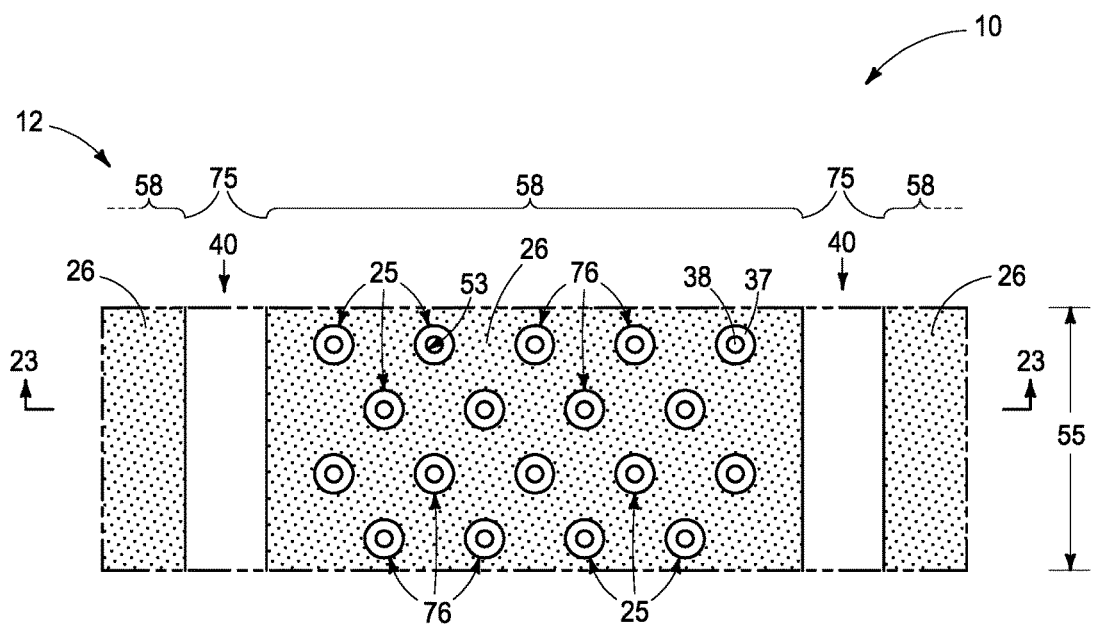
Figure 23:
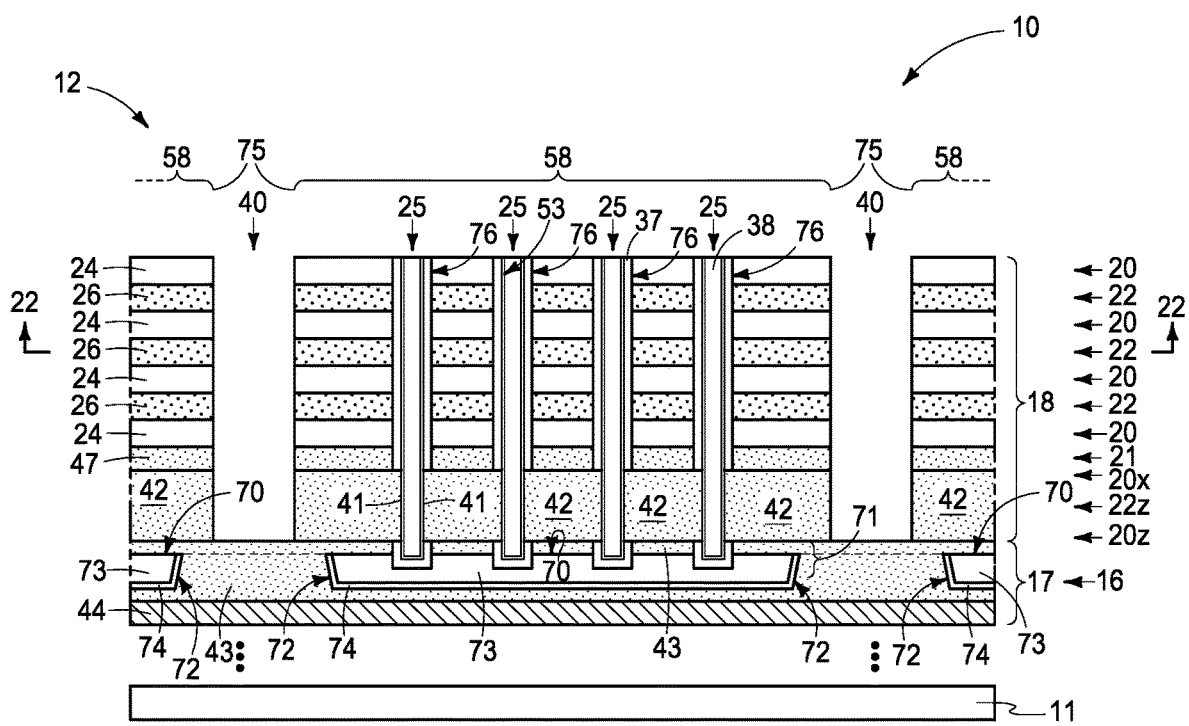
Figure 24:
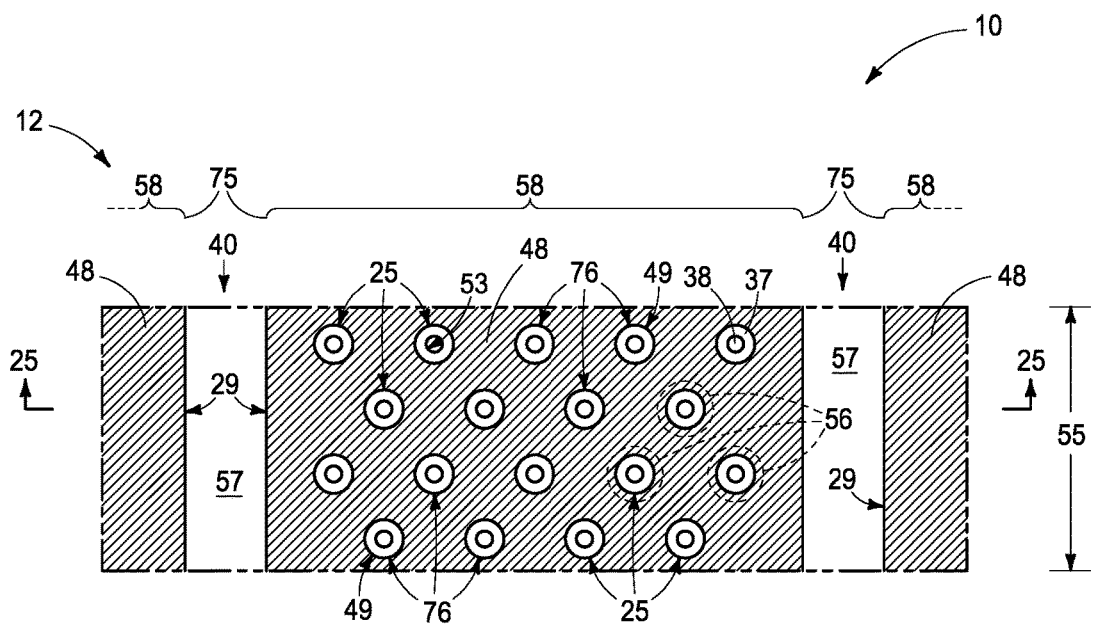
Figure 25:
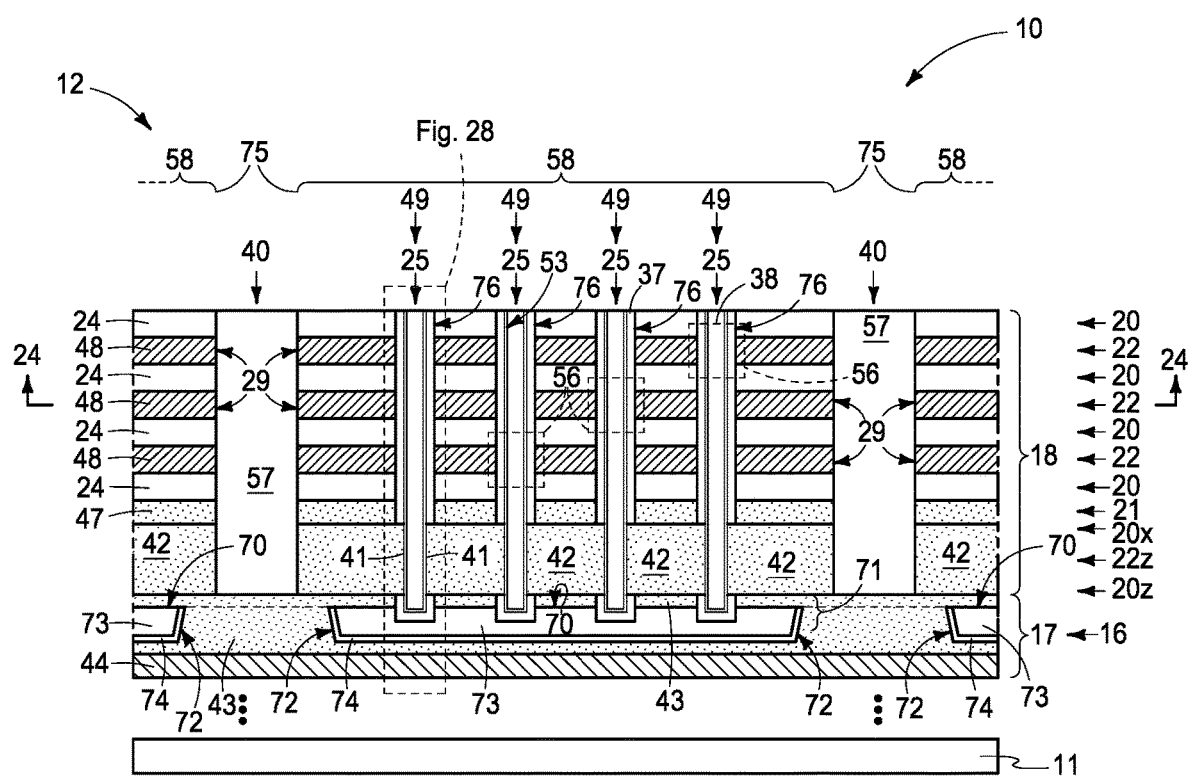
Figure 26:
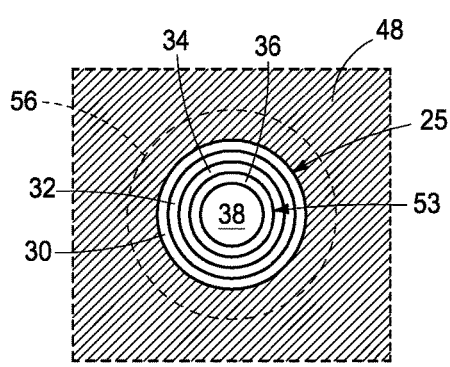
Figure 27:
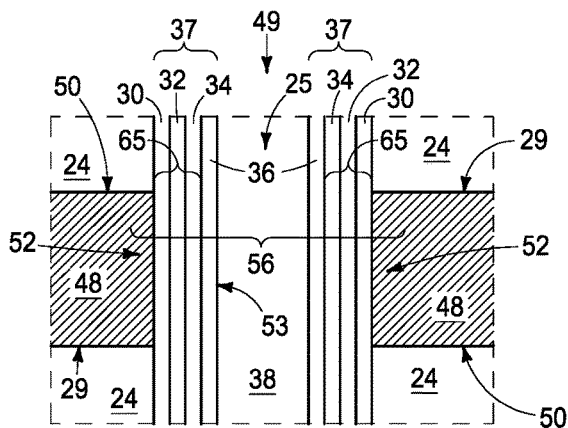
Figure 28:
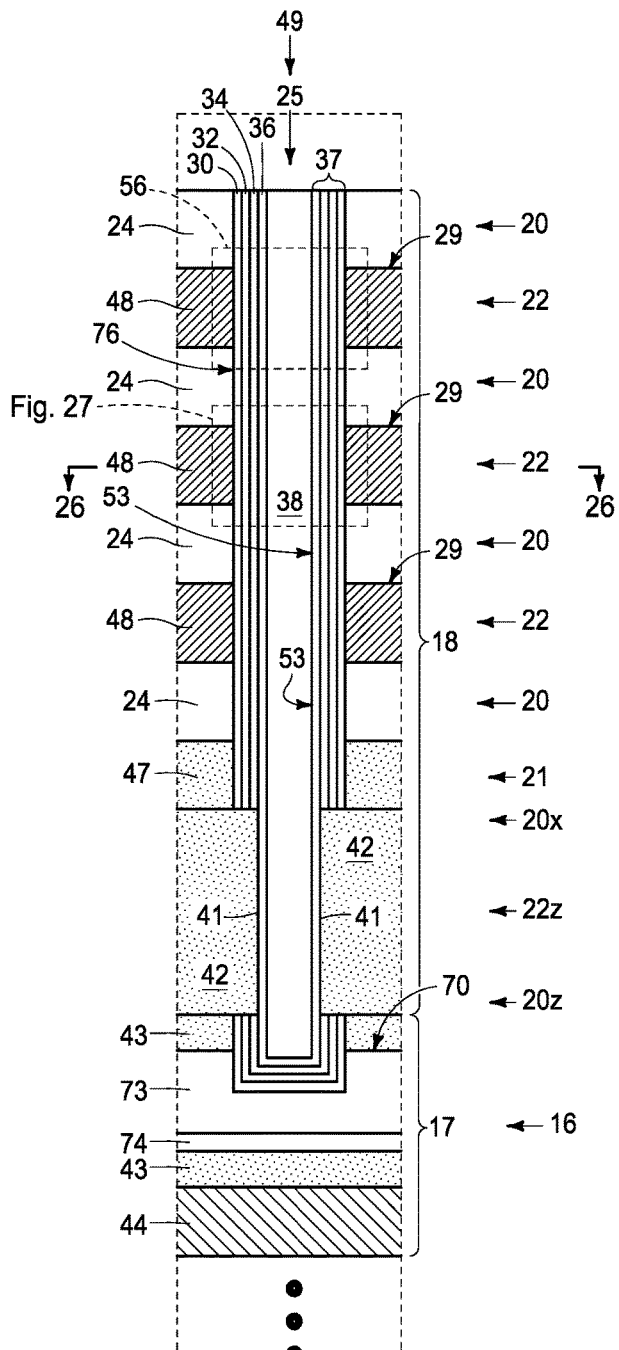

Referring to FIGS. 22 and 23, conductive material 42 has been removed from trenches 40 as has sacrificial liner 81 (not there-shown). Sacrificial liner 81 (when present) may be removed before or after forming conductive material 42. Conductive material 42 and liner 81 have also been removed from trenches 40 (when present, and in one such embodiment). In one embodiment as shown, conducting material 47 of tier 21 and conductive material 42 of tier 22z being directly against one another may collectively be considered as the lowest conductive tier at least in array 12.

Referring to FIGS. 24-28, material 26 (not shown) of conductive tiers 22 has been removed, for example by being isotropically etched away through trenches 40 ideally selectively relative to the other exposed materials (e.g., using liquid or vapor $H_3PO_4$ as a primary etchant where material 26 is silicon nitride and other materials comprise one or more oxides or polysilicon). Material 26 (not shown) in conductive tiers 22 in the example embodiment is sacrificial and has been replaced with conducting material 48, and which has thereafter been removed from trenches 40, thus forming individual conductive lines 29 (e.g., wordlines) and elevationally-extending strings 49 of individual transistors and/or memory cells 56.

A thin insulative liner (e.g., $Al_2O_3$ and not shown) may be formed before forming conducting material 48. Approximate locations of some transistors and/or some memory cells 56 are indicated with a bracket or with dashed outlines, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally between control-gate region 52 and channel material 36. In one embodiment and as shown with respect to the example "gate-last" processing, conducting material 48 of conductive tiers 22 is formed after forming openings 25 and/or trenches 40. Alternately, the conducting material of the conductive tiers may be formed before forming channel openings 25 and/or trenches 40 (not shown), for example with respect to "gate-first" processing.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Intervening material 57 has been formed in trenches 40 and thereby laterally-between and longitudinally-along immediately-laterally-adjacent memory blocks 58. Intervening material 57 may provide lateral electrical isolation (insulation) between immediately-laterally-adjacent memory blocks. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, and $Al_2O_3$. Intervening material 57 may include through array vias (not shown).

Any other attribute(s) or aspect(s) as shown and/or described herein with respect to other embodiments may be used.

Figure 29:
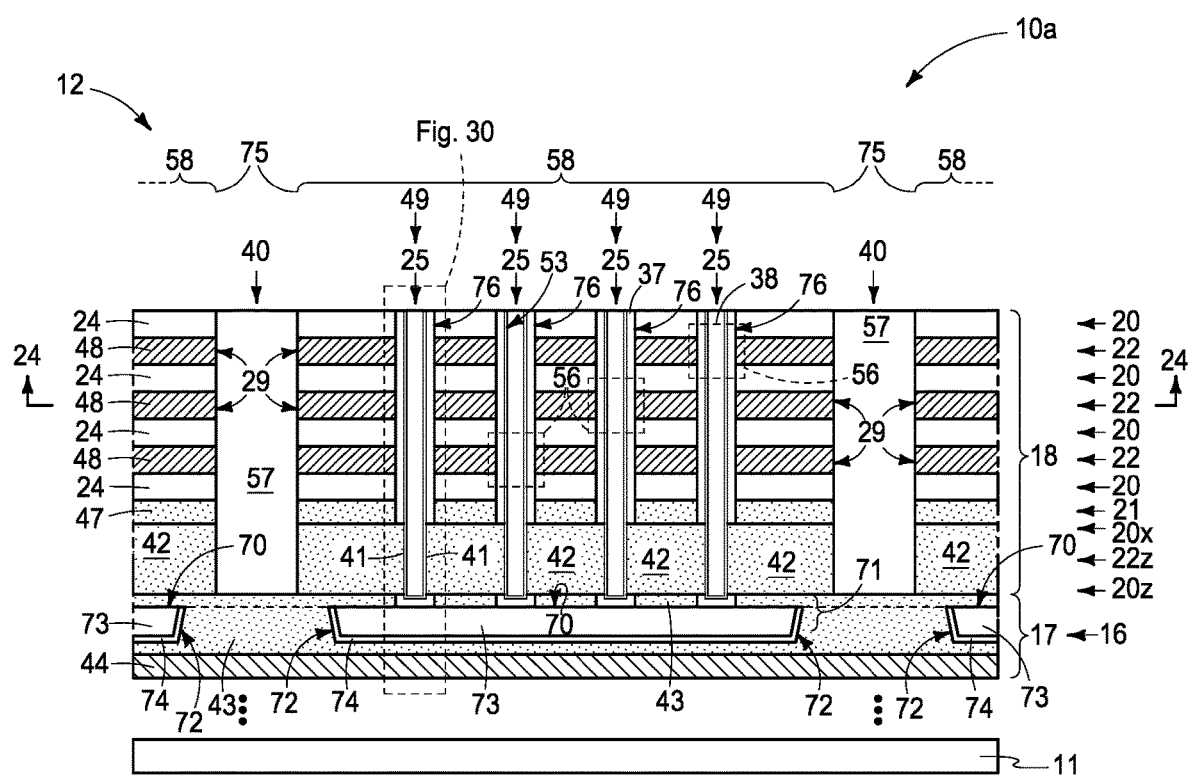
Figure 30:
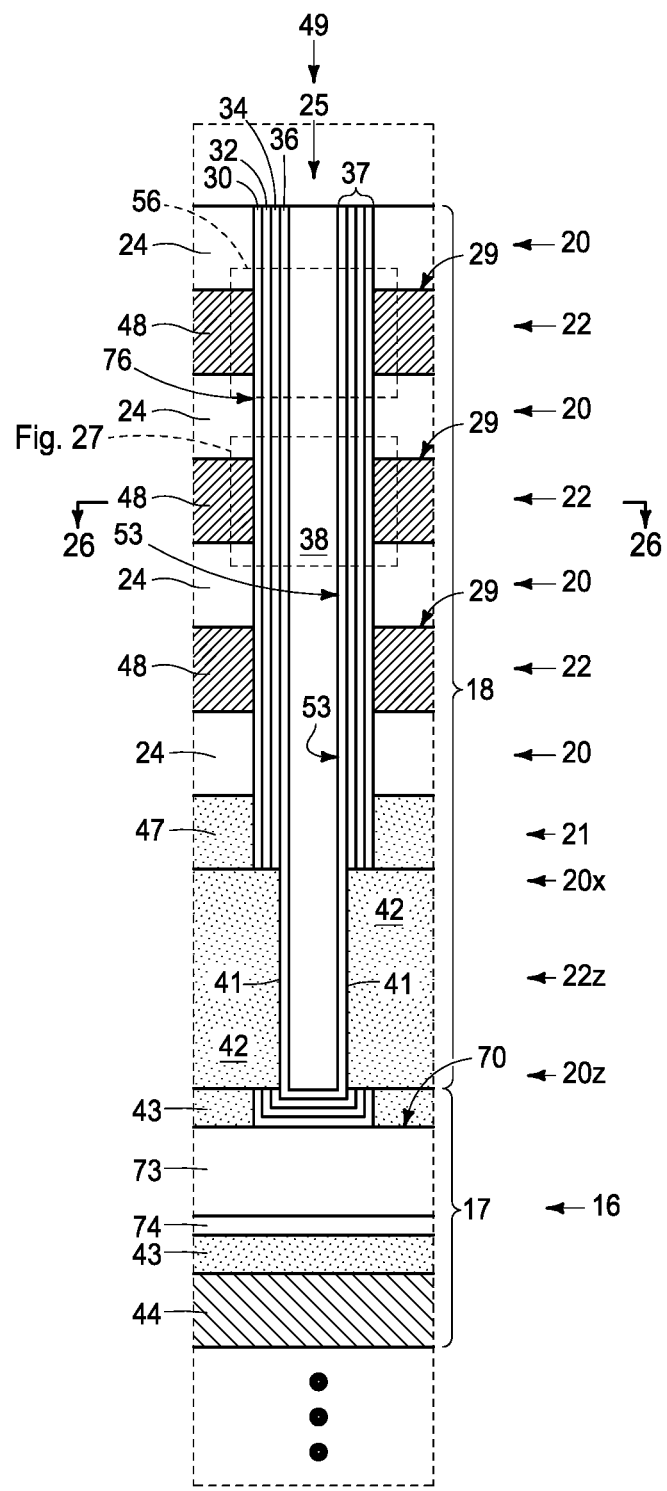

The above-described embodiments form channel openings 25 and resultant channel-material-string constructions 76 to extend into etch-stop material 70. FIGS. 29 and 30 show an example alternate embodiment construction 10a where channel openings 25 and resultant channel-material-string constructions 76 do not extend into etch-stop material 70. Like numerals from the above-described embodiments have been used where appropriate, with some construction differences being indicated with the suffix "a". Any other attribute(s) or aspect(s) as shown and/or described herein with respect to other embodiments may be used.

In one embodiment, a method used in forming a memory array (e.g., 12) comprising strings (e.g., 49) of memory cells (e.g., 56) comprises forming a conductor tier (e.g., 16) comprising conductor material (e.g., 17) on a substrate (e.g., 11). The conductor tier comprises etch-stop material (e.g., 70) spanning laterally-across and laterally-between multiple locations (e.g., 27) where individual channel-material-string constructions (e.g., 76) will be formed. The etch-stop material is of different composition from an upper portion (e.g., 71) of the conductor material. The upper portion of the conductor material is formed to be directly above the etch-stop material. Laterally-spaced memory-block regions (e.g., 58) are formed and that individually comprise a vertical stack (e.g., 18) comprising alternating first tiers (e.g., 22) and second tiers (e.g., 20) directly above the conductor tier and the etch-stop material. Material of the first tiers (e.g., 26) is of different composition from material of the second tiers (e.g., 24). Channel openings (e.g., 25) are etched through the first tiers, the second tiers, and the upper portion of the conductor material to stop on the etch-stop material. A channel-material-string construction (e.g., 76) is formed in individual of the channel openings directly above the etch-stop material. The channel material (e.g., 36) of the channel-material-string construction directly electrically couples to the conductor material in the conductor tier. Any other attribute(s) or aspect(s) as shown and/or described herein with respect to other embodiments may be used.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., 12) comprising strings (e.g., 49) of memory cells (e.g., 56) comprises laterally-spaced memory blocks (e.g., 58) individually comprising a vertical stack (e.g., 18) comprising alternating insulative tiers (e.g., 20) and conductive tiers (e.g., 22) above a conductor tier (e.g., 16). Channel-material-string constructions (e.g., 76) of memory cells (e.g., 56) extend through the insulative tiers and the conductive tiers. The channel material (e.g., 36) of the channel-material-string constructions directly electrically couples to conductor material (e.g., 17) of the conductor tier. Substructure material (e.g., 70) is in the conductor tier and spans laterally-across and laterally-between bottoms of multiple of the channel-material-string constructions. The substructure material is of different composition from an upper portion of the conductor material. The substructure material comprises laterally-opposing sides (e.g., 72) that taper laterally-inward moving deeper into the conductor tier. Any other attribute(s) or aspect(s) as shown and/or described herein with respect to other embodiments may be used.

In one embodiment, a memory array (e.g., 12) comprising strings (e.g., 49) of memory cells (e.g., 56) comprises laterally-spaced memory blocks (e.g., 58) individually comprising a vertical stack (e.g., 18) comprising alternating insulative tiers (e.g., 20) and conductive tiers (e.g., 22) above a conductor tier (e.g., 16). Channel-material-string constructions (e.g., 76) of memory cells (e.g., 56) extend through the insulative tiers and the conductive tiers. The channel material (e.g., 36) of the channel-material-string constructions directly electrically couples to conductor material (e.g., 17) of the conductor tier. Substructure material (e.g., 70) is in the conductor tier and spans laterally-across and laterally-between bottoms of multiple of the channel-material-string constructions. The substructure material is of different composition from an upper portion (e.g., 71) of the conductor material. The substructure material comprises laterally-opposing sides (e.g., 72) that are spaced laterally-inward of laterally-opposing sides (e.g., 75) of the laterally-spaced memory blocks. Any other attribute(s) or aspect(s) as shown and/or described herein with respect to other embodiments may be used.

In one embodiment, a memory array (e.g., 12) comprising strings (e.g., 49) of memory cells (e.g., 56) comprises laterally-spaced memory blocks (e.g., 58) individually comprising a vertical stack (e.g., 18) comprising alternating insulative tiers (e.g., 20) and conductive tiers (e.g., 22) above a conductor tier (e.g., 16). Channel-material-string constructions (e.g., 76) of memory cells (e.g., 56) extend through the insulative tiers and the conductive tiers. The channel material (e.g., 36) of the channel-material-string constructions directly electrically couples to conductor material (e.g., 17) of the conductor tier. Substructure material (e.g., 70) is in the conductor tier and spans laterally-across and laterally-between bottoms of multiple of the channel-material-string constructions. The substructure material is of different composition from an upper portion (e.g., 71) of the conductor material. The upper portion of the conductor material in the conductor tier is directly above the substructure material. Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 450 from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/ drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/ component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 90° or at one or more other angles (i.e., other than the straight angle).

The composition of any of the conductive/conductor/ conducting materials herein may be conductive metal material and/or conductively-doped semiconductive/semiconductor/semiconducting material. "Metal material" is any one or combination of an elemental metal, any mixture or alloy of two or more elemental metals, and any one or more metallic compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprising strings of memory cells comprises forming a conductor tier comprising conductor material on a substrate. The conductor tier comprises etch-stop material spanning laterally-across and laterally-between multiple locations where individual channel-material-string constructions will be formed. The etch-stop material is of different composition from an upper portion of the conductor material. Laterally-spaced memory-block regions individually comprising a vertical stack comprising alternating first tiers and second tiers are formed directly above the conductor tier and the etch-stop material. Material of the first tiers is of different composition from material of the second tiers. The etch-stop material is formed to comprise (a) or (b), where (a): laterally-opposing sides that taper laterally-inward moving deeper into the conductor tier; and (b): laterally-opposing sides that are everywhere spaced laterally-inward of laterally-opposing sides of the laterally-spaced memory-block regions. Channel openings are etched through the first tiers and the second tiers to stop on the etch-stop material. A channel-material-string construction in individual of the channel openings is formed directly above the etch-stop material. The channel material of the channel-material-string construction is directly electrically coupled to the conductor material in the conductor tier.

In some embodiments, a method used in forming a memory array comprising strings of memory cells comprises forming a conductor tier comprising conductor material on a substrate. The conductor tier comprises etch-stop material spanning laterally-across and laterally-between multiple locations where individual channel-material-string constructions will be formed. The etch-stop material is of different composition from an upper portion of the conductor material. The upper portion of the conductor material is formed to be directly above the etch-stop material. Laterally-spaced memory-block regions individually comprising a vertical stack comprising alternating first tiers and second tiers are formed directly above the conductor tier and the etch-stop material. Material of the first tiers is of different composition from material of the second tiers, Channel openings are etched through the first tiers, the second tiers, and the upper portion of the conductor material to stop on the etch-stop material. A channel-material-string construction in individual of the channel openings is formed directly above the etch-stop material. The channel material of the channel-material-string construction is directly electrically coupled to the conductor material in the conductor tier.

In some embodiments, a memory array comprises strings of memory cells. The memory array comprises laterally-spaced memory blocks individually comprising a vertical stack comprising alternating insulative tiers and conductive tiers above a conductor tier. Channel-material-string constructions of memory cells extend through the insulative tiers and the conductive tiers. The channel material of the channel-material-string constructions is directly electrically coupled to conductor material of the conductor tier. Substructure material is in the conductor tier and spans laterally-across and laterally-between bottoms of multiple of the channel-material-string constructions. The substructure material is of different composition from an upper portion of the conductor material. The substructure material comprises laterally-opposing sides that taper laterally-inward moving deeper into the conductor tier.

In some embodiments, a memory array comprises strings of memory cells. The memory array comprises laterally-spaced memory blocks individually comprising a vertical stack comprising alternating insulative tiers and conductive tiers above a conductor tier. Channel-material-string constructions of memory cells extend through the insulative tiers and the conductive tiers. The channel material of the channel-material-string constructions is directly electrically coupled to conductor material of the conductor tier. Substructure material is in the conductor tier and spans laterally-across and laterally-between bottoms of multiple of the channel-material-string constructions. The substructure material is of different composition from an upper portion of the conductor material. The substructure material comprises laterally-opposing sides that are spaced laterally-inward of laterally-opposing sides of the laterally-spaced memory blocks.

In some embodiments, a memory array comprises strings of memory cells. The memory array comprises laterally-spaced memory blocks individually comprising a vertical stack comprising alternating insulative tiers and conductive tiers above a conductor tier. Channel-material-string constructions of memory cells extend through the insulative tiers and the conductive tiers. The channel material of the channel-material-string constructions is directly electrically coupled to conductor material of the conductor tier. Substructure material is in the conductor tier and spans laterally-across and laterally-between bottoms of multiple of the channel-material-string constructions. The substructure material is of different composition from an upper portion of the conductor material. The upper portion of the conductor material in the conductor tier is directly above the substructure material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array comprising strings of memory cells, comprising:
    forming a conductor tier comprising conductor material on a substrate, the conductor tier comprising etch-stop material spanning laterally-across and laterally-between multiple locations where individual channel-material-string constructions will be formed, the etch-stop material being of different composition from an upper portion of the conductor material;
    forming laterally-spaced memory-block regions individually comprising a vertical stack comprising alternating first tiers and second tiers directly above the conductor tier and the etch-stop material, material of the first tiers being of different composition from material of the second tiers;
    the etch-stop material being formed to comprise (a) or (b), where
        (a): laterally-opposing sides that taper laterally-inward moving deeper into the conductor tier; and
        (b): laterally-opposing sides that are everywhere spaced laterally-inward of laterally-opposing sides of the laterally-spaced memory-block regions;
    etching channel openings through the first tiers and the second tiers to stop on the etch-stop material; and
    forming a channel-material-string construction in individual of the channel openings directly above the etch-stop material, the channel material of the channel-material-string construction directly electrically coupling to the conductor material in the conductor tier.

2. The method of claim 1 comprising the (a).

3. The method of claim 1 comprising the (b).

4. The method of claim 1 comprising the (a) and the (b).

5. The method of claim 1 wherein the etch-stop material comprises conductive material.

6. The method of claim 1 wherein the etch-stop material comprises semiconductive material.

7. The method of claim 1 wherein the etch-stop material comprises insulative material.

8. The method of claim 7 wherein the insulative material comprises an aluminum oxide.

9. The method of claim 7 wherein the insulative material comprises an aluminum oxide atop a silicon oxide.

10. The method of claim 7 wherein the etch-stop material comprises at least one of conductive material and semiconductive material.

11. The method of claim 1 wherein the etch-stop material comprises at least one of carbon, a silicon nitride, a carbon-doped silicon nitride, a metal nitride, and a metal silicide.

12. The method of claim 1 wherein the upper portion comprises conductively-doped polysilicon and the etch-stop material comprises an aluminum oxide.

13. The method of claim 1 comprising forming the upper portion of the conductor material directly above the etch-stop material and etching the channel openings therethrough.

14. The method of claim 1 comprising forming the channel openings and the channel-material-string construction to extend into the etch- stop material.

15. The method of claim 1 comprising forming the channel openings and the channel-material-string construction to not extend into the etch-stop material.

16. A method used in forming a memory array comprising strings of memory cells, comprising:
forming a conductor tier comprising conductor material on a substrate, the conductor tier comprising etch-stop material spanning laterally-across and laterally-between multiple locations where individual channel-material-string constructions will be formed, the etch-stop material being of different composition from an upper portion of the conductor material, the upper portion of the conductor material being formed to be directly above the etch-stop material;
forming laterally-spaced memory-block regions individually comprising a vertical stack comprising alternating first tiers and second tiers directly above the conductor tier and the etch-stop material, material of the first tiers being of different composition from material of the second tiers;
etching channel openings through the first tiers, the second tiers, and the upper portion of the conductor material to stop on the etch-stop material; and
forming a channel-material-string construction in individual of the channel openings directly above the etch-stop material, the channel material of the channel-material-string construction directly electrically coupling to the conductor material in the conductor tier.

17. The method of claim 16 wherein the etch-stop material comprises conductive material.

18. The method of claim 16 wherein the etch-stop material comprises semiconductive material.

19. The method of claim 16 wherein the etch-stop material comprises insulative material.

20. The method of claim 19 wherein the insulative material comprises an aluminum oxide.

21. The method of claim 19 wherein the insulative material comprises an aluminum oxide atop a silicon oxide.

22. The method of claim 19 wherein the etch-stop material comprises at least one of conductive material and semiconductive material.

23. The method of claim 16 wherein the etch-stop material comprises at least one of carbon, a silicon nitride, a carbon-doped silicon nitride, a metal nitride, and a metal silicide.

24. The method of claim 16 wherein the upper portion comprises conductively-doped polysilicon and the etch-stop material comprises an aluminum oxide.

25. The method of claim 16 comprising forming the channel openings and the channel-material-string construction to extend into the etch-stop material.

26. The method of claim 16 comprising forming the channel openings and the channel-material-string construction to not extend into the etch-stop material.

* * * * *